United States Patent
Zhou et al.

(10) Patent No.: US 9,162,365 B2
(45) Date of Patent: Oct. 20, 2015

(54) METHOD FOR CASCADING AND MOLDING LED FILAMENT SUPPORT BASED ON SUPPORT FLITCH

(71) Applicant: Lin'an New Sanlian Lighting Electric Co., Ltd., Lin'an, Zhejiang Province (CN)

(72) Inventors: Yongjun Zhou, Lin'an (CN); Yifan Fan, Lin'an (CN)

(73) Assignee: LIN'AN NEW SANLIAN LIGHTING ELECTRIC CO., LTD., Lin'an, Zhejiang Province (CN)

( * ) Notice: Subject to any disclaimer, the term of this patent is extended or adjusted under 35 U.S.C. 154(b) by 0 days.

(21) Appl. No.: 14/384,241

(22) PCT Filed: Jan. 8, 2014

(86) PCT No.: PCT/CN2014/070295
§ 371 (c)(1),
(2) Date: Sep. 10, 2014

(87) PCT Pub. No.: WO2015/000289
PCT Pub. Date: Jan. 8, 2015

(65) Prior Publication Data
US 2015/0082955 A1    Mar. 26, 2015

(30) Foreign Application Priority Data

Jul. 1, 2013    (CN) ............................ 2013 1 0276199

(51) Int. Cl.
*H01L 21/00*    (2006.01)
*B26D 3/00*    (2006.01)
*F21S 4/00*    (2006.01)
*F21V 19/00*    (2006.01)

(52) U.S. Cl.
CPC ... *B26D 3/00* (2013.01); *F21S 4/00* (2013.01); *F21V 19/00* (2013.01); *Y10T 83/0524* (2013.01)

(58) Field of Classification Search
None
See application file for complete search history.

(56) References Cited

U.S. PATENT DOCUMENTS

2013/0081447 A1* 4/2013 Carter et al. ................. 73/30.01

* cited by examiner

*Primary Examiner* — Seahvosh Nikmanesh
(74) *Attorney, Agent, or Firm* — PROI Intellectual Property US

(57) ABSTRACT

The invention relates to a method for cascading and molding an LED filament support based on a support flitch. A plurality of supports may be separated apart from the support flitch as a whole body, thus reducing welded amount and increasing efficiency. The support flitch comprises a group of supports arranged in parallel and numbered as a first support, a second support, a third support, and so on, till an n-th support one after another. According to three different cutting ways, an inner extension section, an outer extension section, an inner connection side, and a middle connection side at the upper side of the support, as well as the inner extension section, the outer extension section, the inner connection side, and the middle connection side at the lower side of the support are cut out respectively, one group or two groups of the cascaded LED filament supports may be obtained.

2 Claims, 4 Drawing Sheets

METHOD FOR CASCADING AND MOLDING LED FILAMENT SUPPORT BASED ON SUPPORT FLITCH

CROSS REFERENCE TO RELATED APPLICATIONS

The present application is the US national stage of International Patent Application PCT/CN2014/070295 filed on Jan. 8, 2014, which, in turn, claims priority to Chinese Patent Application CN201310276199.6 filed on Jul. 1, 2013.

FIELD OF THE INVENTION

The invention relates to the lighting technical field, particularly to a method for cascading and molding an LED filament support based on a support flitch.

BACKGROUND OF THE INVENTION

If an LED filament adopts an LED as a light source, as it has better lighting efficiency, it has wider and wider application.

A conventional LED bulb generally adopts more than two filaments, is connected in series after being welded with a wire, and emits light after being powered on. As to this LED bulb, as the filaments are independent from each other when produced, it has many welding points, costs much manpower, requires high proficiency of employees and needs higher productivity to be improved.

SUMMARY OF THE INVENTION

The object of the invention is to overcome the defects of the above technical background and provide a method for cascading and molding an LED filament support based on a support flitch. With the mothed, a plurality of the supports may be separated apart from the support flitch as a whole body, thus reducing welded amount and increasing working efficiency.

The invention may be obtained through the following technical solution:

The invention relates to a method for cascading and molding an LED filament support based on a support flitch, wherein the support flitch includes a group of supports arranged in parallel and numbered as a first support, a second support, a third support, and so on, till an n-th support one after another;

the support flitch still includes two connection portions, the upper ends of all of the supports are integrated as a whole with the connection portions at the upper side of the support flitch, the lower ends of all of the supports are integrated as a whole with the connection portions at the lower side of the support flitch, a group of through holes are provided on the connection portions between the adjacent supports, the group of the through holes divide the connection portions between the adjacent supports into an inner connection side, a middle connection side and an outer connection side which are connected in parallel, wherein a first inner connection side, a first middle connection side and a first outer connection side are between a first support and a second support;

a second inner connection side, a second middle connection side and a second outer connection side are between a second support and a third support;

a third inner connection side, a third middle connection side and a third outer connection side are between a third support and a fourth support;

therefore, an n−1th inner connection side, an n−1th middle connection side and an n−1th connection side are between an n−1th connection support and an n-th support;

the portion of the support between the inner connection side and the middle connection side is an inner extension section, the portion of the support between the middle connection side and the outer connection side is an outer connection side, wherein the portion of the first support between the first connection side and the first middle connection side is a first inner extension section, the portion of the first support between the first middle connection side and the first outer connection side is a first outer extension section;

the portion of the second support between the second inner connection side and the second middle connection side is a second inner extension section, the portion of the second support between the second middle connection side and the second outer connection side is a second outer extension section;

the portion of the third support between the third inner connection side and the third middle connection side is a third inner extension section, the portion of the third support between the third middle connection side and the third outer connection side is a third outer extension section;

therefore, the portion of an n−1th support between an n−1 inner connection side and an n−1th middle connection side is an n−1th inner extension section, the portion of the n−1th support between the n−1th middle connection side and the n−1th outer connection side is an n−1th outer extension section;

the portion of the nth support between the n−1th inner connection side and the n−1th middle connection side is an nth inner extension section, the portion of the nth support between the n−1th middle connection side and the n−1th outer connection side is an nth outer extension section;

it is characterized in that the method for cascading and molding the LED filament support based on the support flitch includes the following steps:

I. cutting out all of the inner extension sections in the connection portions at the upper side and the lower side, at this time, the middle connection side, the outer connection side and the outer extension section of each connection portion are all cut out and separated apart;

II. cutting out the inner connection side which is in the connection portion at the upper side and of which the serial number is an even number;

III. cutting out the inner connection side which is in the connection portion at the lower side and of which the serial number is an odd number;

after the cutting operation, a group of cascaded LED filament supports are obtained; or, the method for cascading and molding the LED filament support includes the following steps:

I. cutting out all of the outer extension sections in the connection portions at the upper side and the lower side, at this time, all of the outer connection sides are still cut out and separated apart;

II. cutting out the inner connection side and the middle connection side which are in the connection portion at the upper side and of which the serial numbers are integer multiples of four;

III. cutting out the inner connection side which is in the connection portion at the upper side and of which the serial number is an odd number;

IV. cutting out the inner extension section which is in the connection portion at the upper side and of which the serial number is two, six, ten, and so on, wherein the tolerance of the serial number between the cut inner extension sections is four;

V. cutting out the inner extension section which is in the connection portion at the upper side and of which the serial number is three, seven, eleven, and so on, wherein the tolerance of the serial number between the cut inner extension sections is four;

VI. cutting out the inner connection side and the middle connection side which are in the connection portion at the lower side and of which the serial numbers are two, six, ten; the tolerance of the serial number between the cut inner connection sides is four, the tolerance of the serial number between the cut middle connection sides is four;

VII. cutting out the inner connection side which is in the connection portion at the lower side and of which the serial number is an odd number;

VIII. cutting out the inner extension section which is in the connection portion at the lower side and of which the serial number is one, five, nine, thirteen, and so on, wherein the tolerance of the serial number between the cut inner extension sections is four;

IX. cutting out the inner extension section which is in the connection portion at the lower side and of which the serial number is four, eight, twelve, sixteen, and so on, wherein the tolerance of the serial number between the cut inner extension sections is four;

after the cutting operation, two groups of cascaded LED filament supports are obtained;

or, the method for cascading and molding the LED filament support includes the following steps:

I. cutting out all of the outer extension sections in the connection portions at the upper side and the lower side, at this time, the outer connection side is still cut out and separated apart;

II. cutting out the inner extension section which is in the connection portion at the upper side and of which the serial number is an even number;

III. cutting out all of the inner connection sides in the connection portion at the upper side;

IV. cutting out the inner extension section which is in the connection portion at the lower side and of which the serial number is an odd number;

V. cutting out all of the inner connection sides in the connection portion at the lower side;

after the cutting operation, two groups of cascaded LED filament supports are obtained.

The invention has the following effects: with the method of the invention, a plurality of the supports may be cut out and separated apart from the support flitch as a continuous whole body; then, according to the power demand of a bulb, the support is cut out based on a certain number (for example, each group has two, four or eight supports). As the supports within each group are connected in series with each other, two ends of the group of the supports are only welded with a positive pole and a negative pole, thereby greatly reducing welded time, improving production efficiency and reducing production cost.

EMBODIMENTS OF THE INVENTION

The invention is further described with the combination of the drawings of the description.

Figure 1:
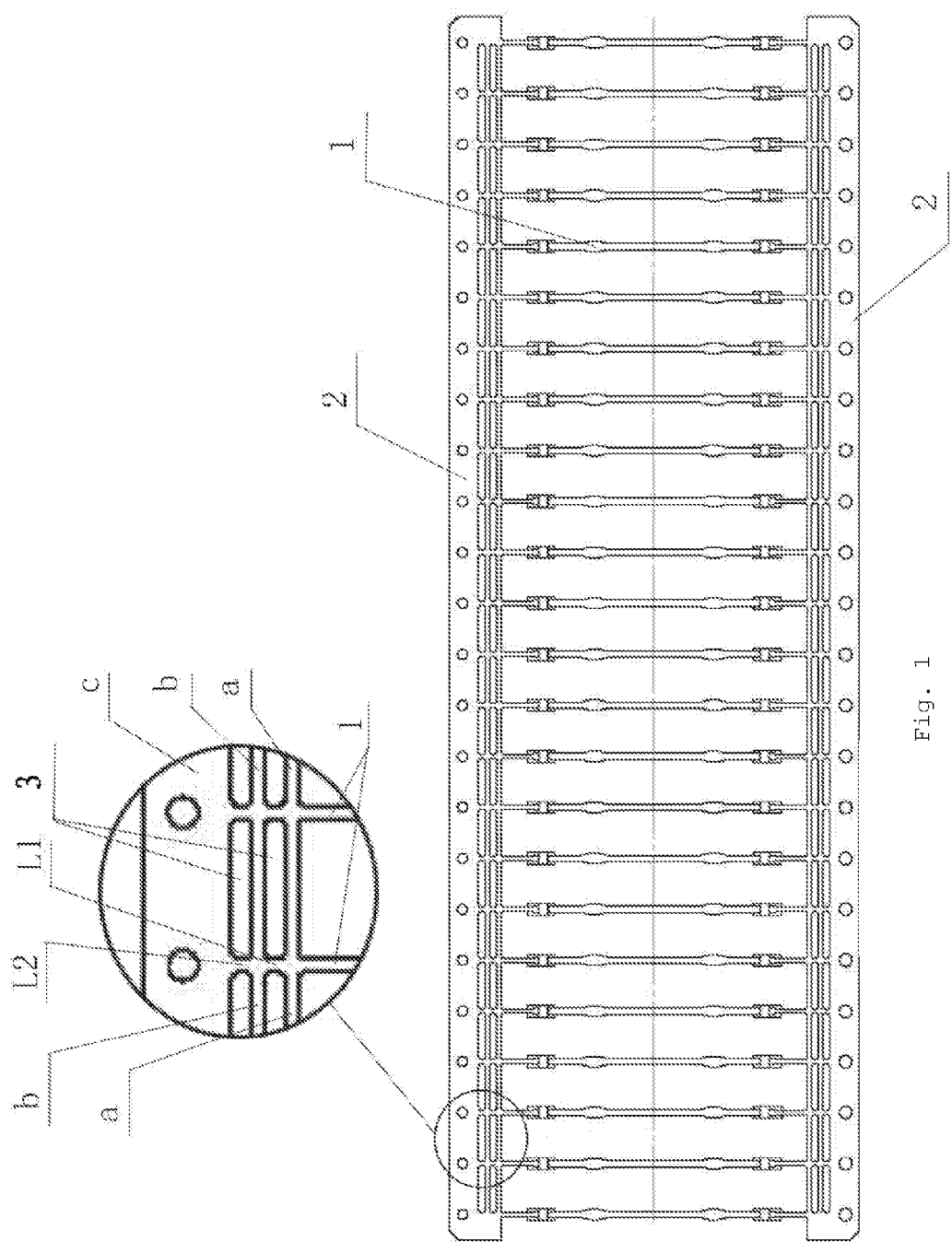
FIG. 1 is a schematic diagram of a main view structure of a support flitch.

As shown in FIG. 1, the invention relates to a method for cascading and molding an LED filament support based on a support flitch, wherein the support flitch includes a group of supports 1 arranged in parallel and numbered as a first support, a second support, a third support, and so on, till an n-th support one after another;

the support flitch (made of metal materials such as copper, aluminum or steel) still includes two connection portions 2, the upper ends of the supports are integrated as a whole with the connection portions at the upper side of the support flitch, the lower ends of the supports are integrated as a whole with the connection portions at the lower side of the support flitch, a group of elongated through holes 3 are provided on the connection portions between the adjacent supports, the group of the through holes divide the connection portions between the adjacent supports into an inner connection side a, a middle connection side b and an outer connection side c which are connected in parallel, wherein a first inner connection side, a first middle connection side and a first outer connection side are between a first support and a second support;

a second inner connection side, a second middle connection side and a second outer connection side are between a second support and a third support;

a third inner connection side, a third middle connection side and a third outer connection side are between a third support and a fourth support;

therefore, an n−1th inner connection side, an n−1th middle connection side and an n−1th connection side are between an n−1th connection support and an n-th support;

the portion of the support between the inner connection side and the middle connection side is an inner extension section L1, the portion of the support between the middle connection side and the outer connection side is an outer connection side L2, wherein the portion of the first support between the first connection side and the first middle connection side is a first inner extension section, the portion of the first support between the first middle connection side and the first outer connection side is a first outer extension section;

the portion of the second support between the second inner connection side and the second middle connection side is a second inner extension section, the portion of the second support between the second middle connection side and the second outer connection side is a second outer extension section;

the portion of the third support between the third inner connection side and the third middle connection side is a third inner extension section, the portion of the third support between the third middle connection side and the third outer connection side is a third outer extension section;

therefore, the portion of the n−1th support between the n−1 inner connection side and the n−1th middle connection side is an n−1th inner extension section, the portion of the n−1th support between the n−1th middle connection side and the n−1th outer connection side is an n−1th outer extension section;

the portion of the nth support between the n−1th inner connection side and the n−1th middle connection side is an nth inner extension section, the portion of the nth support between the n−1th middle connection side and the n−1th outer connection side is an nth outer extension section;

A method for cascading and molding an LED filament support based on a support flitch according to the invention has the three following examples:

EXAMPLE 1

The method for cascading and molding the LED filament support includes the following steps:

I. cutting out all of the inner extension sections in the connection portions at the upper side and the lower side, at this time, the middle connection side, the outer connection side and the outer extension section of each connection portion are all cut out and separated apart;

II. cutting out the inner connection side which is in the connection portion at the upper side and of which the serial number is an even number; for example, the second inner connection side, a fourth inner connection side, and a sixed inner connection side;

III. cutting out the inner connection side which is in the connection portion at the lower side and of which the serial number is an odd number; for example, the first inner connection side, the third inner connection side, and a fifth inner connection side;

The above steps may be carried out at the same time or step by step, depending on the concrete requirements.

Figure 2:
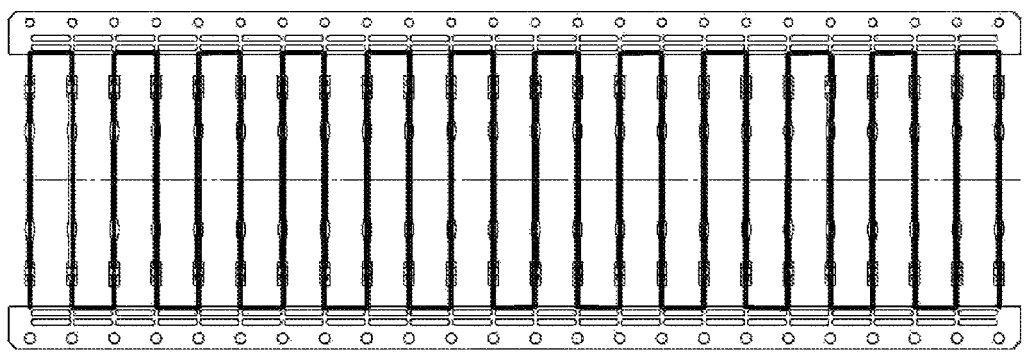
FIG. 2 is a schematic diagram of Example 1 of the invention.
Figure 3:
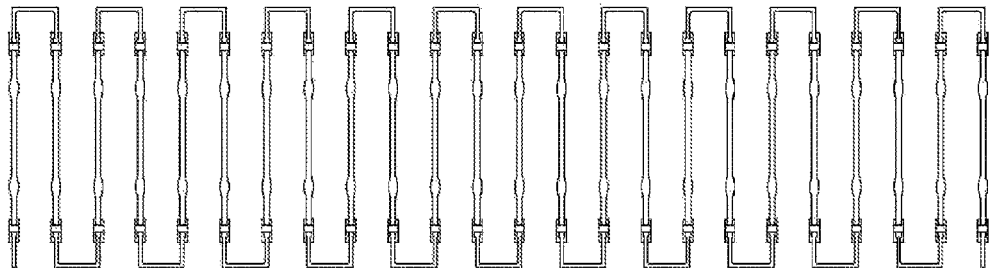
FIG. 3 is a structural diagram of a cut LED filament support of Example 1 according to the invention.

As shown in FIG. 2, the bold portion is a structure reserved on the support flitch, after the cutting operation, a group of cascaded LED filament supports as shown in FIG. 3 are obtained;

EXAMPLE 2

The method for cascading and molding the LED filament support includes the following steps:

I. cutting out all of the outer extension sections in the connection portions at the upper side and the lower side, at this time, all of the outer connection sides are still cut out and separated apart;

II. cutting out the inner connection side and the middle connection side which are in the connection portion at the upper side and of which the serial numbers are integer multiples of four;

III. cutting out the inner connection side which is in the connection portion at the upper side and of which the serial number is an odd number;

IV. cutting out the inner extension section which is in the connection portion at the upper side and of which the serial number is two, six, ten, and so on, wherein the tolerance of the serial number between the cut inner extension sections is four;

V. cutting out the inner extension section which is in the connection portion at the upper side and of which the serial number is three, seven, eleven, and so on, wherein the tolerance of the serial number between the cut inner extension sections is four;

VI. cutting out the inner connection side and the middle connection side which are in the connection portion at the lower side and of which the serial numbers are two, six, ten; the tolerance of the serial number between the cut inner connection sides is four, the tolerance of the serial number between the cut middle connection sides is four;

VII. cutting out the inner connection side which is in the connection portion at the lower side and of which the serial number is an odd number;

VIII. cutting out the inner extension section which is in the connection portion at the lower side and of which the serial number is one, five, nine, thirteen, and so on, wherein the tolerance of the serial number between the cut inner extension sections is four;

IX. cutting out the inner extension section which is in the connection portion at the lower side and of which the serial number is four, eight, twelve, sixteen, and so on, wherein the tolerance of the serial number between the cut inner extension sections is four;

The above steps may be carried out at the same time or step by step, depending on the concrete requirements.

Figure 4:
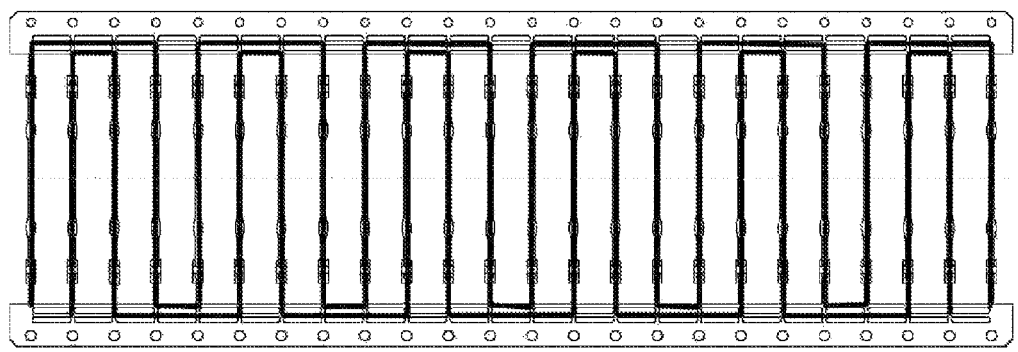
FIG. 4 is a schematic diagram of Example 2 of the invention.
Figure 5:
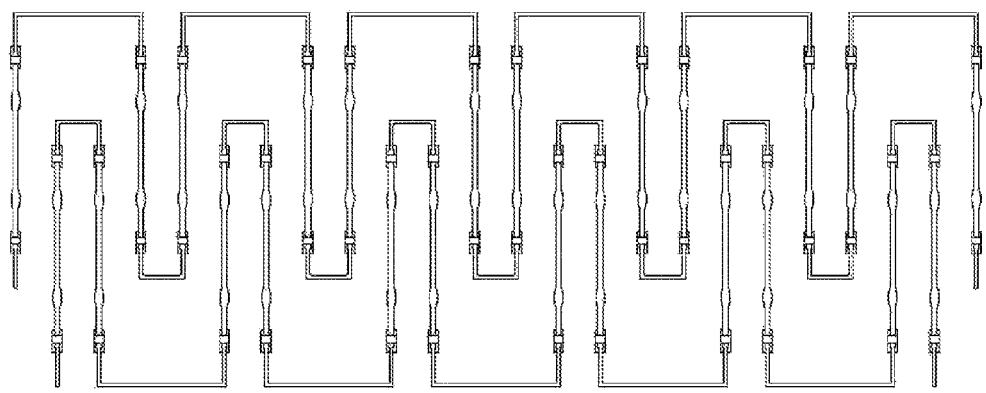
FIG. 5 is a structural diagram of a cut LED filament support of Example 2 according to the invention.

As shown in FIG. 4, the bold portion is a structure reserved on the support flitch, after the cutting operation, two groups of cascaded LED filament supports as shown in FIG. 5 are obtained;

EXAMPLE 3

The method for cascading and molding the LED filament support includes the following steps:

I. cutting out all of the outer extension sections in the connection portions at the upper side and the lower side, at this time, the outer connection side is still cut out and separated apart;

II. cutting out the inner extension section which is in the connection portion at the upper side and of which the serial number is an even number;

III. cutting out all of the inner connection sides in the connection portion at the upper side;

IV. cutting out the inner extension section which is in the connection portion at the lower side and of which the serial number is an odd number;

V. cutting out all of the inner connection sides in the connection portion at the lower side;

The above steps may be carried out at the same time or step by step, depending on the concrete requirements.

Figure 6:
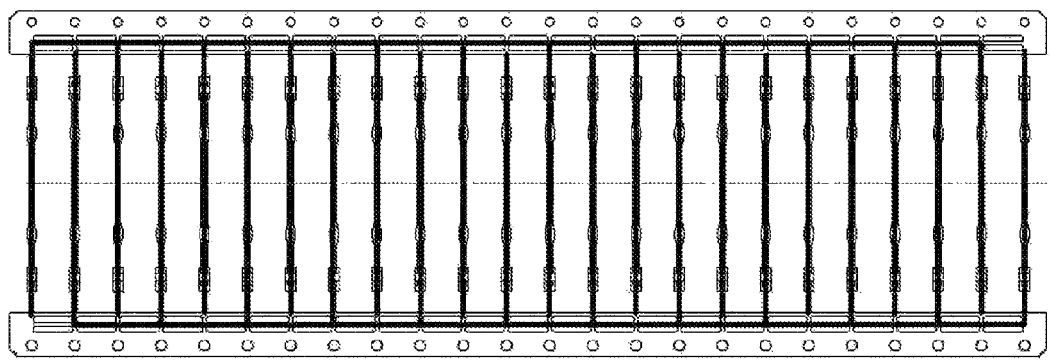
FIG. 6 is a schematic diagram of Example 3 of the invention.
Figure 7:
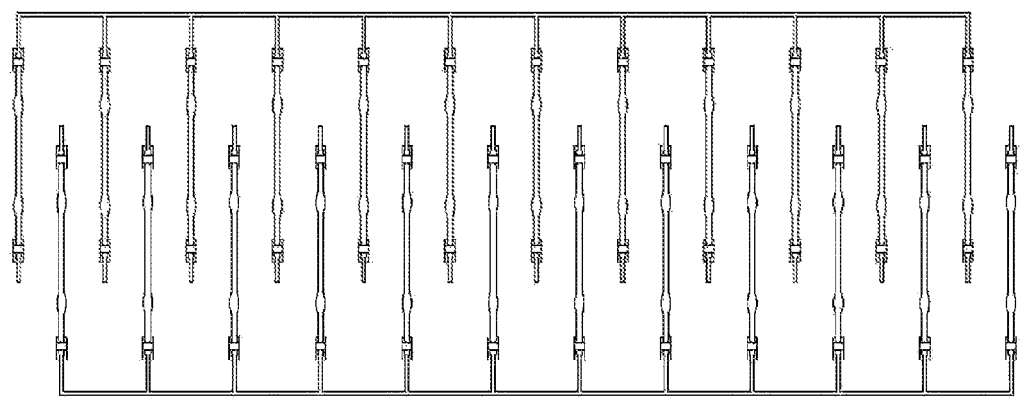
FIG. 7 is a structural diagram of a cut LED filament support of Example 3 according to the invention.

As shown in FIG. 6, the bold portion is a structure reserved on the support flitch, after the cutting operation, two groups of cascaded LED filament supports as shown in FIG. 7 are obtained;

The above examples are only used for describing but not limiting the technical solution of the invention. Although the invention is described in details with reference of the above examples, the person skilled in the art shall understand that he still may amend the technical solution recorded in the above examples or equally replacing the partial technical features therein. However, these amendment or replacements do not make the essence of corresponding technical solution be apart from the spirit and scope of the technical solution of each example.

The invention claimed is:

1. A method for cascading and molding an LED filament support based on a support flitch, wherein the support flitch comprises a group of supports arranged in parallel and numbered as a first support, a second support, a third support, and so on, till an n-th support one after another;

the support flitch still comprises two connection portions, the upper ends of all of the supports are integrated as a whole with the connection portions at the upper side of the support flitch, the lower ends of all of the supports are integrated as a whole with the connection portions at the lower side of the support flitch, a group of through holes are provided on the connection portions between the adjacent supports, the group of the through holes divide the connection portions between the adjacent supports into an inner connection side, a middle connection side and an outer connection side which are connected in parallel, wherein a first inner connection side, a first middle connection side and a first outer connection side are between a first support and a second support;

a second inner connection side, a second middle connection side and a second outer connection side are between a second support and a third support;

a third inner connection side, a third middle connection side and a third outer connection side are between a third support and a fourth support;

therefore, an n−1th inner connection side, an n−1th middle connection side and an n−1th connection side are between an n−1th connection support and an n-th support;

the portion of the support between the inner connection side and the middle connection side is an inner extension section, the portion of the support between the middle connection side and the outer connection side is an outer connection side, wherein the portion of the first support between the first inner connection side and the first middle connection side is a first inner extension section, the portion of the first support between the first middle connection side and the first outer connection side is a first outer extension section;

the portion of the second support between the second inner connection side and the second middle connection side is a second inner extension section, the portion of the second support between the second middle connection side and the second outer connection side is a second outer extension section;

the portion of the third support between the third inner connection side and the third middle connection side is a third inner extension section, the portion of the third support between the third middle connection side and the third outer connection side is a third outer extension section;

therefore, the portion of an n−1th support between the n−1 inner connection side and an n−1th middle connection side is an n−1th inner extension section, the portion of the n−1th support between the n−1th middle connection side and the n−1th outer connection side is an n−1th outer extension section;

the portion of an nth support between the n−1th inner connection side and the n−1th middle connection side is an nth inner extension section, the portion of the nth support between the n−1th middle connection side and the n−1th outer connection side is an nth outer extension section;

it is characterized in that the method for cascading and molding the LED filament support based on the support flitch comprises the following steps:

I. cutting out all of the inner extension sections in the connection portions at the upper side and the lower side, at this time, the middle connection side, the outer connection side and the outer extension section of each connection portion are all cut out and separated apart;

II. cutting out the inner connection side which is in the connection portion at the upper side and of which the serial number is an even number;

III. cutting out the inner connection side which is in the connection portion at the lower side and of which the serial number is an odd number;

after the cutting out operation, a group of cascaded LED filament supports are obtained;

or, the method for cascading and molding the LED filament support comprises the following steps:

I. cutting out all of the outer extension sections in the connection portions at the upper side and the lower side, at this time, all of the outer connection sides are still cut out and separated apart;

II. cutting out the inner connection side and the middle connection side which are in the connection portion at the upper side and of which the serial numbers are integer multiples of four;

III. cutting out the inner connection side which is in the connection portion at the upper side and of which the serial number is an odd number;

IV. cutting out the inner extension section which is in the connection portion at the upper side and of which the serial number is two, six, ten, and so on, wherein the tolerance of the serial number between the cut inner extension sections is four;

V. cutting out the inner extension section which is in the connection portion at the upper side and of which the serial number is three, seven, eleven, and so on, wherein the tolerance of the serial number between the cut inner extension sections is four;

VI. cutting out the inner connection side and the middle connection side which are in the connection portion at the lower side and of which the serial numbers are two, six, ten; the tolerance of the serial number between the cut inner connection sides is four; the tolerance of the serial number between the cut middle connection sides is four;

VII. cutting out the inner connection side which is in the connection portion at the lower side and of which the serial number is an odd number;

VIII. cutting out the inner extension section which is in the connection portion at the lower side and of which the serial number is one, five, nine, thirteen, and so on, wherein the tolerance of the serial number between the cut inner extension sections is four;

IX. cutting out the inner extension section which is in the connection portion at the lower side and of which the serial number is four, eight, twelve, sixteen, and so on, wherein the tolerance of the serial number between the cut inner extension sections is four;

after the cutting operation, two groups of cascaded LED filament supports are obtained;

or, the method for cascading and molding the LED filament support comprises the following steps:

I. cutting out all of the outer extension sections in the connection portions at the upper side and the lower side, at this time, the outer connection side is still cut out and separated apart;

II. cutting out the inner extension section which is in the connection portion at the upper side and of which the serial number is an even number;

III. cutting out all of the inner connection sides in the connection portion at the upper side;

IV. cutting out the inner extension section which is in the connection portion at the lower side and of which the serial number is an odd number;

V. cutting out all of the inner connection sides in the connection portion at the lower side;

after the cutting operation, two groups of cascaded LED filament supports are obtained.

2. A method for cascading and molding an LED filament support based on a support flitch according to claim 1, characterized in that the support flitch is made of copper, aluminum or steel.

* * * * *